(12) United States Patent
Hodel et al.

(10) Patent No.: US 9,704,756 B2
(45) Date of Patent: Jul. 11, 2017

(54) METHODS OF MANUFACTURING SEMICONDUCTOR DEVICES

(71) Applicant: Infineon Technologies AG, Neubiberg (DE)

(72) Inventors: Uwe Hodel, Munich (DE); Andreas Martin, Munich (DE); Wolfgang Heinrigs, Dorfen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/708,486

(22) Filed: May 11, 2015

(65) Prior Publication Data

US 2015/0243655 A1 Aug. 27, 2015

Related U.S. Application Data

(62) Division of application No. 11/949,605, filed on Dec. 3, 2007, now Pat. No. 9,059,282.

(51) Int. Cl.
*H01L 21/336* (2006.01)
*H01L 21/8234* (2006.01)
(Continued)

(52) U.S. Cl.
CPC .... *H01L 21/823493* (2013.01); *H01L 21/768* (2013.01); *H01L 21/823481* (2013.01);
(Continued)

(58) Field of Classification Search
CPC ............... H01L 27/088; H01L 29/0649; H01L 21/823493; H01L 29/66659; H01L 29/66681; H01L 29/0696; H01L 29/1095; H01L 29/7816; H01L 21/823481; H01L 29/7835; H01L 27/0207; H01L 21/823437; H01L 29/7831; H01L 29/1083; H01L 29/0653; H01L 29/402; H01L 29/0692; H01L 21/823828; H01L 21/768
(Continued)

(56) References Cited

U.S. PATENT DOCUMENTS 5,635,736 A * 6/1997 Funaki ................ H01L 23/4824
257/202
6,242,787 B1 6/2001 Nakayama et al.
(Continued)

FOREIGN PATENT DOCUMENTS

DE 10303232 A1 8/2003

OTHER PUBLICATIONS

Brisbin, D., et al., "Effect of Photo Misalignment on N-LDMOS Hot Carrier Device Reliability," 2006 IIRW Final Report, 2006, pp. 44-48, IEEE, Los Alamitos, CA.
(Continued)

*Primary Examiner* — Shouxiang Hu
(74) *Attorney, Agent, or Firm* — Slater Matsil, LLP

(57) ABSTRACT

Semiconductor devices and methods of manufacture thereof are disclosed. In one embodiment, a semiconductor device includes an array having at least one first region and at least one second region. The at least one first region includes at least one first device oriented in a first direction. The at least one second region includes at least one second device oriented in a second direction. The second direction is different than the first direction.

19 Claims, 8 Drawing Sheets

(51) Int. Cl.
*H01L 21/8238* (2006.01)
*H01L 21/768* (2006.01)
*H01L 27/02* (2006.01)
*H01L 27/088* (2006.01)
*H01L 29/66* (2006.01)
*H01L 29/06* (2006.01)
*H01L 29/10* (2006.01)
*H01L 29/40* (2006.01)
*H01L 29/78* (2006.01)

(52) U.S. Cl.
CPC .. H01L 21/823828 (2013.01); H01L 27/0207 (2013.01); H01L 27/088 (2013.01); H01L 29/0649 (2013.01); H01L 29/0696 (2013.01); H01L 29/1095 (2013.01); H01L 29/66659 (2013.01); H01L 29/66681 (2013.01); H01L 29/7816 (2013.01); H01L 29/7835 (2013.01); *H01L 21/823437* (2013.01); *H01L 29/0653* (2013.01); *H01L 29/0692* (2013.01); *H01L 29/1083* (2013.01); *H01L 29/402* (2013.01); *H01L 29/7831* (2013.01)

(58) Field of Classification Search
USPC ................................. 438/283, 197, 275, 150
See application file for complete search history.

(56) References Cited

U.S. PATENT DOCUMENTS

| 6,365,932 B1* | 4/2002 | Kouno ................ H01L 27/0255 257/133 |
|---|---|---|
| 6,479,877 B1 | 11/2002 | Koyama et al. |
| 6,593,621 B2 | 7/2003 | Tsuchiko et al. |
| 6,730,960 B2 | 5/2004 | Forbes |
| 2003/0006412 A1 | 1/2003 | Martin et al. |
| 2003/0062845 A1 | 4/2003 | Yamazaki et al. |
| 2005/0093105 A1 | 5/2005 | Yang et al. |
| 2005/0280082 A1 | 12/2005 | Li et al. |
| 2007/0222022 A1 | 9/2007 | Takeda |

OTHER PUBLICATIONS

Mitros, J.C., et al., "High-Voltage Drain Extended MOS Transistors for 0.18-μn Logic CMOS Process," IEEE Transactions on Electron Devices, Aug. 2001, pp. 1751-1755, vol. 48, No. 8, IEEE, Los Alamitos, CA.

Rickert, P., et al., "SoC Integration in Deep Submicron CMOS," 2004, No. 0-7803-8684, 4 pp., IEEE, Los Alamitos, CA.

* cited by examiner

METHODS OF MANUFACTURING SEMICONDUCTOR DEVICES

The present invention is a divisional application of application Ser. No. 11/949,605 filed on Dec. 3, 2007, which is incorporated herein by reference.

TECHNICAL FIELD

The present invention relates generally to the fabrication of semiconductor devices, and more particularly to the fabrication of devices arranged in an array.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various layers using lithography and etch processes to form circuit components and elements thereon.

A metal oxide semiconductor field effect transistor (MOSFET) is one type of semiconductor device. Many power MOSFETs comprise diffused metal oxide semiconductor (DMOS) devices, for example, which are adapted to operate at relatively high voltages. Examples of DMOS devices include n-channel lateral DMOS devices and p-channel lateral DMOS devices.

DMOS and other high voltage devices present manufacturing challenges, because the high operating voltages cause hot carrier (HC) degradation over time, which shortens device life. Thus, what are needed in the art are improved structures for DMOS devices and methods of manufacture thereof.

SUMMARY OF THE INVENTION

These and other problems are generally solved or circumvented, and technical advantages are generally achieved, by embodiments of the present invention, which provide novel semiconductor devices and methods of manufacture thereof.

In accordance with an embodiment of the present invention, a semiconductor device includes an array having at least one first region and at least one second region. The at least one first region includes at least one first device oriented in a first direction. The at least one second region includes at least one second device oriented in a second direction. The second direction is different than the first direction.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments of the present invention and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in specific contexts, namely implemented in power applications or power control applications for semiconductor devices. Embodiments of the invention may also be implemented in other semiconductor applications such as integrated circuits that include portions comprised of power devices, cellular phone applications, switching applications, and other applications that utilize DMOS devices, for example.

High voltage devices based on CMOS processes, such as lateral DMOS (LDMOS) devices, usually include a current driving device and a drift region which leads to a controlled voltage drop without damaging the gate oxide of the device. LDMOS devices are typically very sensitive to the alignment of a well implant that defines the geometry of the drift region. The performance sensitivity originates in high field effects and current crowding in the current path of the drift region, which leads to high hot carrier degradation or generally to a large statistical spread of the device performance parameters, such as the current $I_{dlin}$ of a LDMOS device. Hot carrier degradation results in a decreased lifetime for LDMOS devices.

Thus, what are needed in the art are improved high voltage devices for semiconductor device applications.

Embodiments of the present invention achieve technical advantages by providing novel high voltage device arrangements that result in reduced hot carrier degradation and reduced statistical spread of performance parameters of the devices. High voltage devices are arranged in arrays in different positional orientations to reduce the deleterious impact of misalignments on the array structure. By rotating some of the high voltage devices by about 90 degrees in various regions of the array, overall array performance is improved, and the lifetime of the array is increased.

Figure 1:
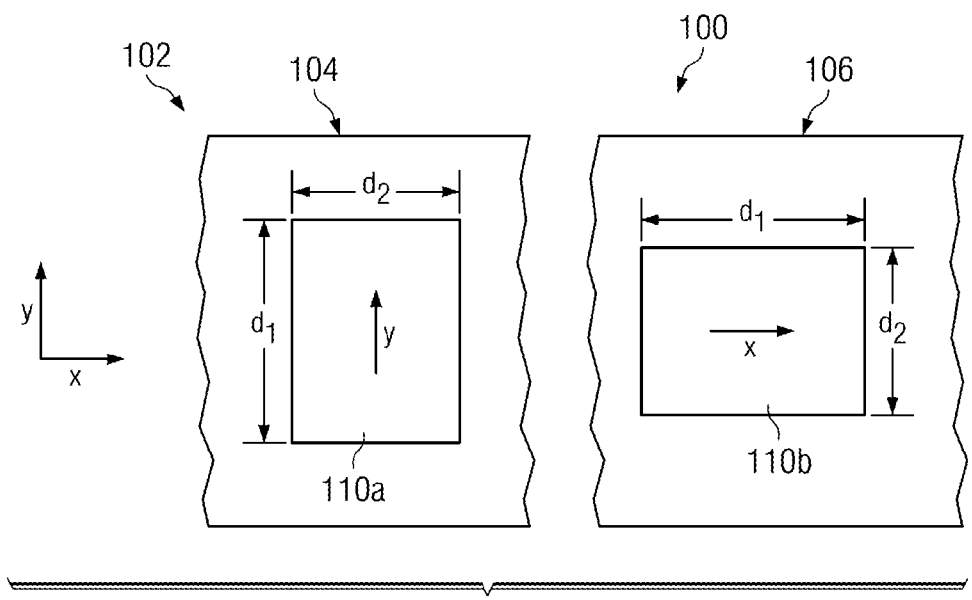
FIG. 1 shows a top view of a first region and a second region of an array of devices of a semiconductor device in accordance with an embodiment of the present invention, wherein devices are oriented differently in the first region and the second region.

FIG. 1 shows a top view of a first region 104 and a second region 106 of an array 102 of devices 110a and 110b of a semiconductor device 100 in accordance with an embodiment of the present invention, wherein devices 110a and 110b are oriented differently in the first region 104 and the second region 106. Only one device 110a and 110b is shown in the first region 104 and the second region 106, respectively, in FIG. 1; however, the first region 104 and the second region 106 may comprise a plurality of devices 110a and 110b (see FIG. 14).

The array 102 preferably comprises at least one first region 104 and at least one second region 106 in accordance with embodiments of the present invention. In some embodiments, the array 102 preferably comprises a plurality of first regions 104 and a plurality of second regions 106, to be described further herein.

Figure 2:
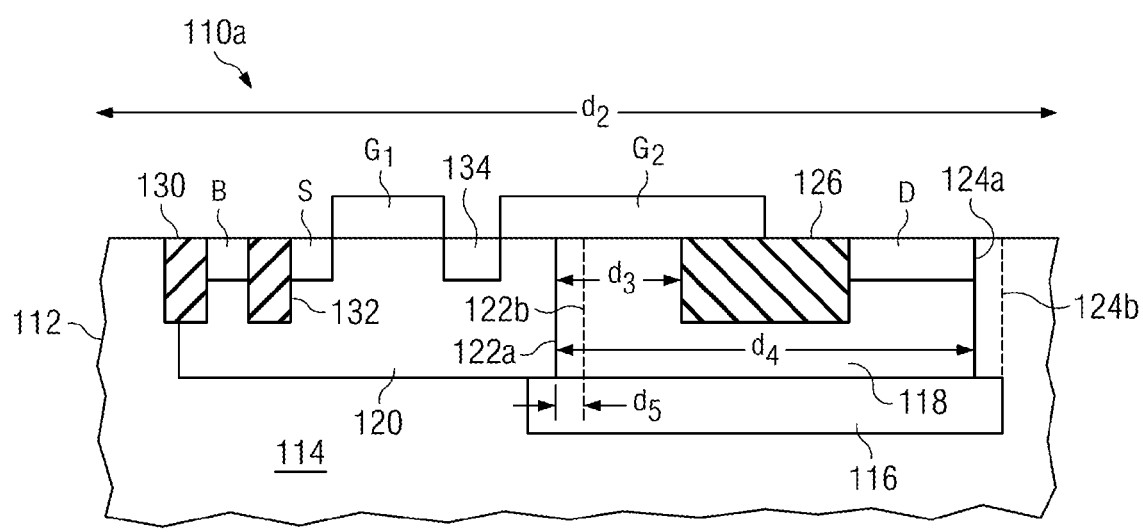
FIG. 2 shows a cross-sectional view of a device of the array of FIG. 1 in accordance with an embodiment of the present invention, wherein the device comprises an n channel lateral DMOS device.

The devices 110a and 110b are formed on a workpiece (not shown in FIG. 1; see workpiece 112 shown in the cross-sectional view of FIG. 2). The workpiece comprises an x direction and a y direction in a top view of the workpiece, the y direction being substantially perpendicular to the x direction. The y direction is also referred to herein as a first direction, and the x direction is also referred to herein as a second direction. The second direction is different than the first direction, for example, and may be substantially perpendicular to the first direction. The second direction may be positioned at about 90 degrees or about 270 degrees with respect to the first direction, for example.

In some embodiments, device 110a comprises at least one first device oriented in the +y direction and/or −y direction in the first region 104, and device 110b comprises at least one second device oriented in the +x direction and/or −x direction in the second region 106. In the embodiment shown in FIG. 1, device 110a is oriented in the +y direction in the first region 104, and device 110b is oriented in the +x direction in the second region 106, for example.

The devices 110a and 110b preferably comprise the same type of device, in some embodiments. For example, device 110a may comprise a first type of transistor and device 110b may comprise a second type of transistor, the second type of transistor being the same as the first type of transistor.

In some embodiments, the devices 110a and 110b preferably comprise high voltage devices adapted to operate at about 2.5 volts or higher, for example. However, alternatively, devices 110a and 110b may be adapted to operate at other voltage levels. In other embodiments, devices 110a and 110b may comprise DMOS devices or LDMOS devices. The devices 110a and 110b may comprise n channel lateral diffused metal oxide semiconductor (LDMOS) devices or p channel LDMOS devices, as examples. The devices 110a and 110b may comprise high voltage field effect transistors (FET's), for example. The FETs may comprise gates having a breakdown voltage, and the high voltage FETs may be adapted to operate at a voltage higher than the breakdown voltage of the gates, for example. Alternatively, the devices 110a and 110b may comprise other types of devices or transistors in accordance with embodiments of the present invention. In some embodiments, the devices 110a and 110b comprise devices for which the performance and/or hot carrier robustness is dependent on the exact alignment or misalignment of one or more process steps, for example. In one or more embodiments, the devices 110a and 110b may, for example, be devices having at least one feature formed by a non-self-aligned process. The features (formed by such a non-self-aligned process) may affect a performance characteristic of the device.

Devices 110a in the first region 104 may be oriented in the first direction or y direction, and devices 110b in the second region 106 may be oriented in the second direction or x direction, as shown. Alternatively, devices 110a in the first region 104 may be oriented in the second direction or x direction, and devices 110b in the second region 106 may be oriented in the first direction or y direction, for example.

Some or all of the devices 110a in the first region 104 and devices 110b in the second region 106 may be coupled together in parallel to achieve a high power transistor array 102, for example. The devices 110a and 110b may be coupled together by conductive lines and vias formed in subsequently formed metallization layers disposed over the devices 110a and 110b, for example, not shown.

The devices 110a and 110b may comprise a dimension or length $d_1$ along one edge and a dimension or width $d_2$ along an adjacent edge. Dimensions $d_1$ and $d_2$ may comprise several nm to 1 or more µm, for example, although alternatively, dimensions $d_1$ and $d_2$ may comprise other dimensions. A gate contact (not shown in FIG. 1; see FIGS. 2 and 3 at $G_2$) may extend substantially the entire length $d_1$ of the devices 110a over a junction (also not shown in FIG. 1; see FIGS. 2 and 3 at 122a) between two wells formed within the workpiece, to be described further herein. Advantageously, orienting the length $d_1$ of devices 110a in the first region 104 substantially perpendicular to the orientation of the length $d_1$ of devices 110b in the second region 106 in accordance with an embodiment of the present invention improves the overall semiconductor device 100 performance, because misalignments of the well regions within the workpiece beneath the gate contact $G_2$ may affect either the first region 104 or the second region 106 of the device, but not both, also to be described further herein.

FIG. 2 shows a cross-sectional view of a device 110a of the array 102 of FIG. 1 in accordance with an embodiment of the present invention, wherein the device 110a comprises an n channel lateral DMOS device. A cross-sectional view of the device 110a across dimension or width $d_2$ is shown.

The device 110a includes a workpiece 112. The workpiece 112 may include a semiconductor substrate comprising silicon or other semiconductor materials and may be covered by an insulating layer, for example. The workpiece 112 may also include other active components or circuits, not shown. The workpiece 112 may comprise silicon oxide over single-crystal silicon, for example. The workpiece 112 may include conductive layers or other semiconductor elements, e.g., transistors, diodes, etc. Compound semiconductors, GaAs, InP, Si/Ge, or SiC, as examples, may be used in place of silicon. The workpiece 112 may comprise a silicon-on-insulator (SOI) or a SiGe-on-insulator substrate, as examples.

The workpiece 112 is lightly implanted with dopants to form a P or N type substrate 114. In the embodiment shown, the workpiece 112 comprises a P type substrate 114, for example. The workpiece 112 is implanted with dopants to form a first well 120, a second well 118, and a third well 116 beneath the second well 118. The first well 120 may comprise a first type of dopant, and the second well may comprise a second type of dopant, for example.

In one embodiment, the substrate 114 is implanted with at least one N type dopant to form the third well 116 comprising an Nband or N well deep within the top surface of the P type substrate 114. Then, the substrate 114 is implanted with P type dopants to form the second well 118 comprising a P well over the third well 116. The substrate 114 is implanted with N type dopants to form the first well 120 comprising an N well adjacent the second well 118. A junction 122a is formed between the first well 120 and the second well 118, as shown. The third well 116 isolates the second well 118 from the substrate 114, for example. The second well 118 comprises a drift region of the device 110a.

Isolation regions 126 that may comprise shallow trench isolation (STI) regions or field oxide (FOX) regions are formed over the second well 118. Isolation regions 130 and 132 may simultaneously be formed over the first well 120 with the formation of isolation regions 126, for example, as shown. Contacts and gates are formed for the device 110a, with the alignment for the various lithography processes used to form the contacts and gates being aligned to the isolation regions 126. A body contact B is formed that makes electrical contact to the first well 120. The bulk substrate 114 may be grounded by a backside contact or elsewhere on the chip, not shown. Alternatively, the bulk substrate 114 may be coupled to the body contact B, e.g., by wiring in a metallization layer, for example, also not shown. A source contact S is formed that makes electrical contact to the first well 120. The source contact S functions as a source contact, rather than being an ohmic contact as the body contact B comprises, for example. A drain contact D is formed that makes electrical contact to the second well 118. The first well 120 functions as a source, and second well 118 functions as a drain of the device 110a, for example. The contacts B, S, and D may be formed in a single manufacturing process step, for example. The lithography processes used to form the contacts B, S, and D may involve aligning to the isolation regions 126 in some embodiments, for example. Contacts 134 may also be formed at a top surface of the workpiece 112 to make electrical contact to the channel region of the device 110a, for example.

A gate oxide (not shown) is formed over the workpiece 112, over the wells 120 and 118, and the isolation region 126. Gates or gate contacts $G_1$ and $G_2$ are formed over the gate oxide. The gate contacts comprise a first gate contact $G_1$ disposed over the first well 120 and a second gate contact $G_2$ disposed over a portion of the first well 120, the junction 122a, a portion of the second well 118, and a portion of the isolation region 126, as shown.

During operation of the device 110a, a voltage is applied at the drain contact D, and current flows from the drain contact D through the second well 118 to the first well 120. A channel region is formed proximate (e.g., beneath) the gates $G_1$ and $G_2$. The device 110a may be controlled by the two gates $G_1$ and $G_2$ so that parallel conduction can occur, in order to achieve a high voltage between the source contact S and drain contact D, for example.

The second well 118 comprises a left side at junction 122a and a right side at 124a in the view shown in FIG. 2. The second well 118 comprises a critical well implant of the device 110a, because the placement or position of the second well 118 has a large impact on the proper functioning of the device 110a, e.g., in the amount of current that flows through the transistor device 110a. In particular, the dimension or distance $d_3$ between the junction 122a and a left edge of the isolation region 126 comprises a critical dimension for the functioning of the device 110a. The larger dimension $d_3$ is, the better the performance of the device 110a is, and the smaller dimension $d_3$ is, the worse the performance of the device 110a is, for example. The second well 118 has a dimension or width $d_4$ and a dimension or length $d_6$, as shown in FIG. 3 in a top view.

Referring again to FIG. 2, if the implantation step for the second well 118 and/or the manufacturing step used to form the isolation region 126 are misaligned, then a misalignment comprising a dimension $d_5$ may occur. If the dimension $d_5$ shortens or decreases dimension $d_3$ between the junction 122a and the isolation region 126, then device performance is decreased. For example, the isolation region 126 may be formed too close to the junction 122a during the lithography process used to form the isolation region 126. Or, the implantation process used to form the second well 118 (which may also involve lithography, because portions of the workpiece 112 may be masked while others are implanted with at least one dopant) may result in the second well 118 being formed too far to the right side, so that the entire dimension or width $d_4$ of the second well 118 is shifted over to the right by the misalignment amount or dimension $d_5$, as shown in phantom in FIG. 2, wherein the misaligned junction 122b comprises the left side of the second well 118 and 124b comprises the right side of the misaligned second well 118.

Figure 3:
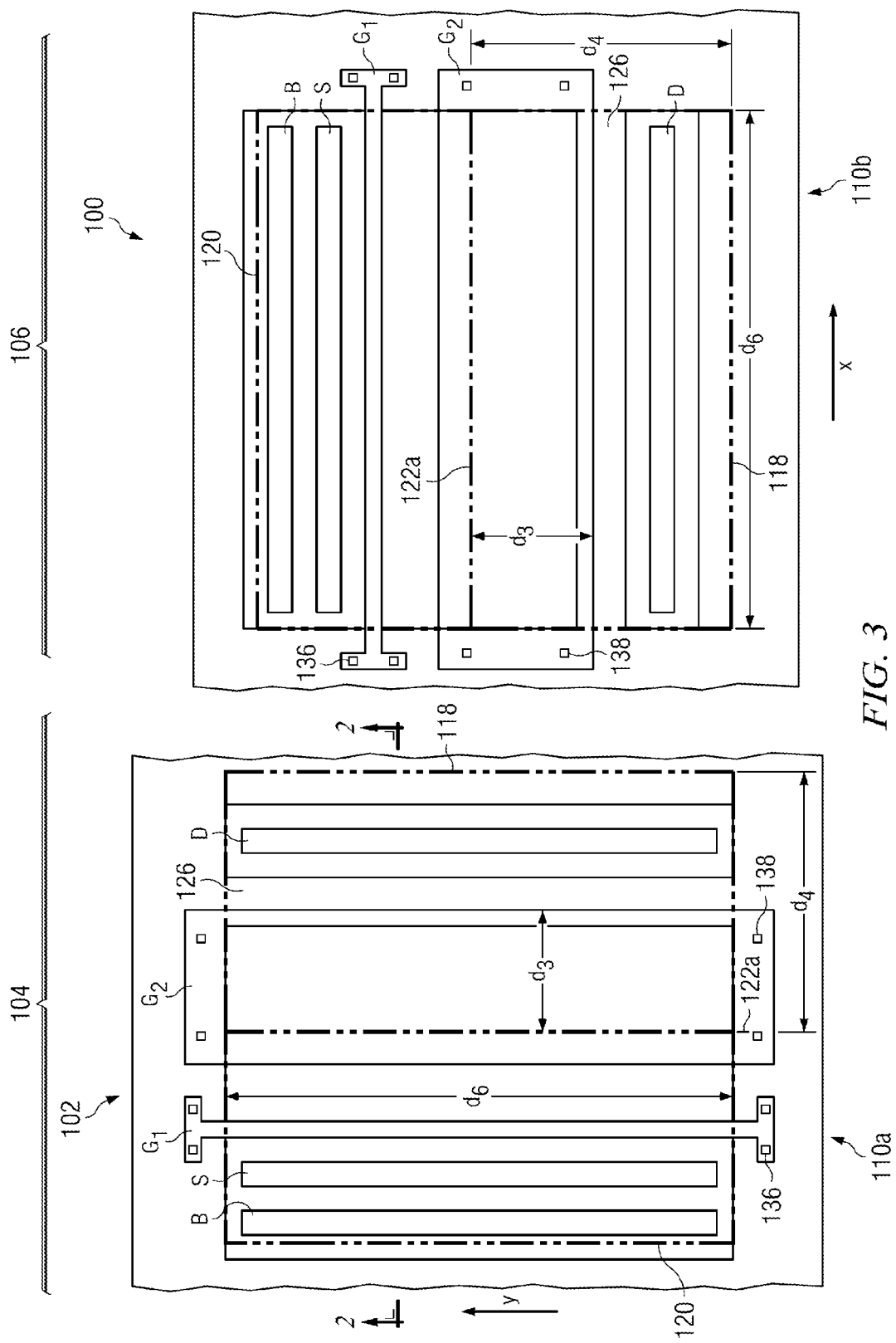
FIG. 3 shows a top view of the device of FIG. 2 implemented in a first region and a second region of an array in accordance with an embodiment of the present invention.

FIG. 3 shows a top view of the device 110a of FIG. 2 implemented in a first region 104 and a second region 106 (shown at device 110b) of an array 102 of a semiconductor device 100 in accordance with an embodiment of the present invention. Vias 136 and 138 provide electrical contact of the gates $G_1$ and $G_2$ to other layers of the semiconductor device. The first well 120 and the second well 118 are shown in phantom disposed beneath the body contact B, source contact S, drain contact D and the gates $G_1$ and $G_2$.

Devices 110a and 110b each comprise a gate contact $G_2$ comprising a length, the gate contact $G_2$ being disposed over a junction 122a between the first well 120 and the second well 118 over substantially the entire length of the gate contact $G_2$. The length of the gate contact $G_2$ of the device 110a in the first region 104 extends in the first direction, and the length of the gate contact $G_2$ of the device 110b in the second region 106 extends in the second direction.

If devices 110a and 110b in the array 102 were oriented in a single direction, e.g., all in the y direction, then a misalignment of the junction 122a or the isolation region 126 would affect all devices 110a and 110b in the array 102. However, advantageously, in accordance with embodiments of the present invention, because devices 110a and 110b are oriented differently in the first region 104 and the second region 106, respectively, some devices 110a are affected by such misalignments, whereas other devices 110b are not affected by the misalignment.

Figure 4:
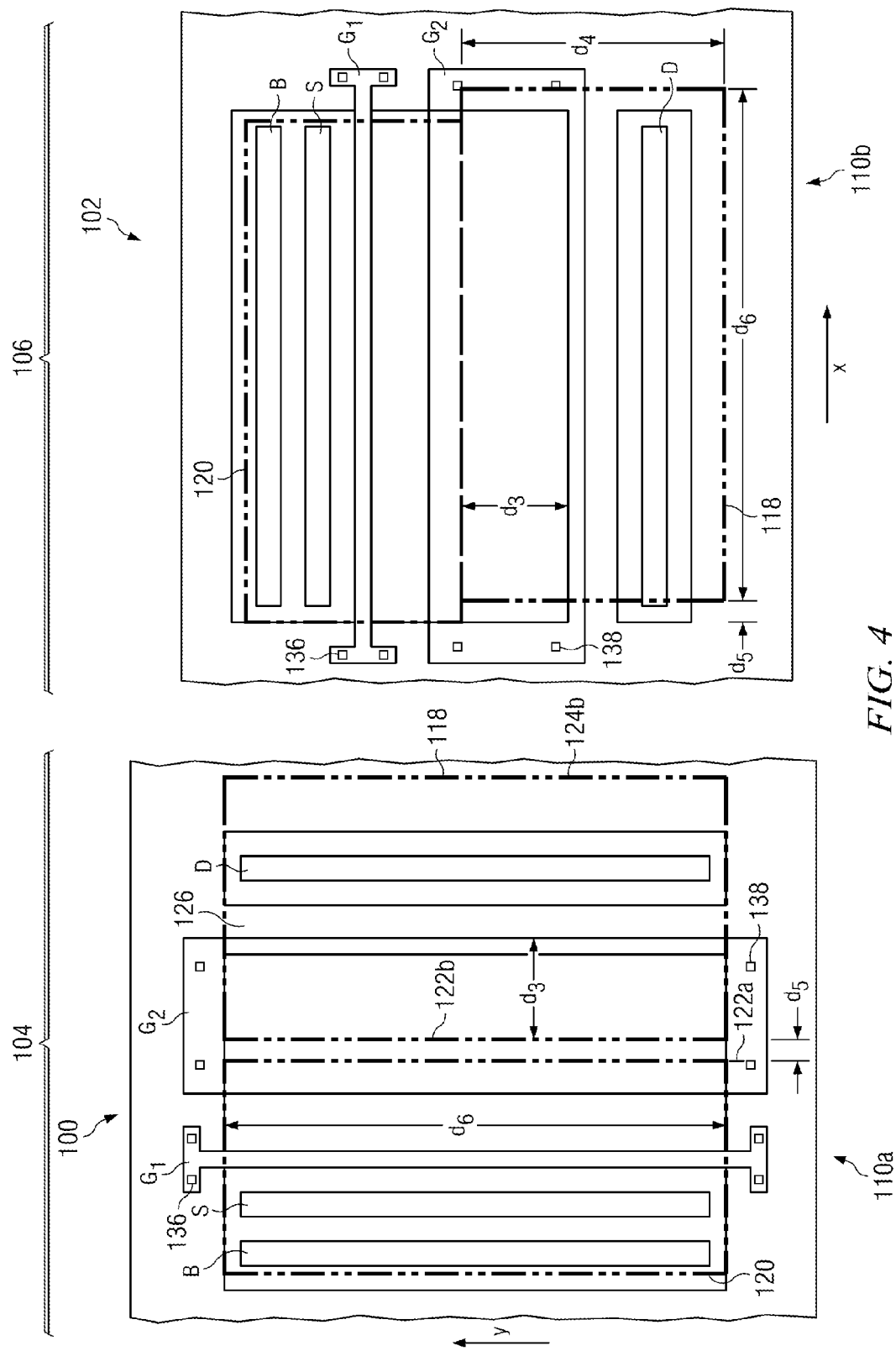
FIG. 4 shows a top view of the semiconductor device shown in FIG. 3 wherein a misalignment of a portion of the device causes decreased device performance in the first region but not in the second region in accordance with an embodiment of the present invention.

FIG. 4 shows a top view of the semiconductor device 100 shown in FIG. 3, illustrating the affect of misalignment on devices 110a and 110b in the array 102. An example is shown wherein the entire second well 118 implantation step is misaligned too far towards the right edge of the device 110a by an amount $d_5$ (as shown in phantom in FIG. 2), which shortens distance $d_3$ between the junction 122a and the isolation region 126 by the amount $d_5$. Thus, the performance of device 110a in the first region 104 is decreased. However, because the device 110b in the second region 106 is oriented in a different direction, e.g., in the x direction, the second well 118 of device 110b is shifted over along the length or dimension $d_6$ of the device 110b by an amount $d_5$, which does not affect the performance of device 110b. The tolerancing of the ends of the gate $G_2$ and wells 118 and 120 may be adapted to accommodate for such length-wise misalignment shifts, for example. Thus, a misalignment of a portion of devices 110a and 110b such as the implantation step used to form the second well 118, or a lithography step to form the isolation region 126, causes decreased performance of device 110a in the first region 104 but does not cause decreased performance of device 110b in the second region 106 in accordance with an embodiment of the present invention. Thus, the overall performance of the array 102 is improved.

Note that if the misalignment causes the second well 118 to shift over to the left, then dimension $d_3$ between the junction 122a and the isolation region 126 of the device 110a in the first region 104 would increase by amount $d_5$. Or, if the isolation region 126 is positioned too far to the right, then dimension $d_3$ would also be increased of the device 110a in the first region 104. In these misalignment situations, the performance of device 110a would be increased in the first region 104 of the array 102, and the performance of device 110b in the second region 106 would not be affected. In such misalignment situations, orienting the devices 110a and 110b differently in the first region 104 and the second region 106 in accordance with embodiments of the present invention results in more predictable performance of the array 102 in the event of misalignment due to implantation or lithography processes, because only some of the devices 110a are affected by the misalignment.

Figure 5:
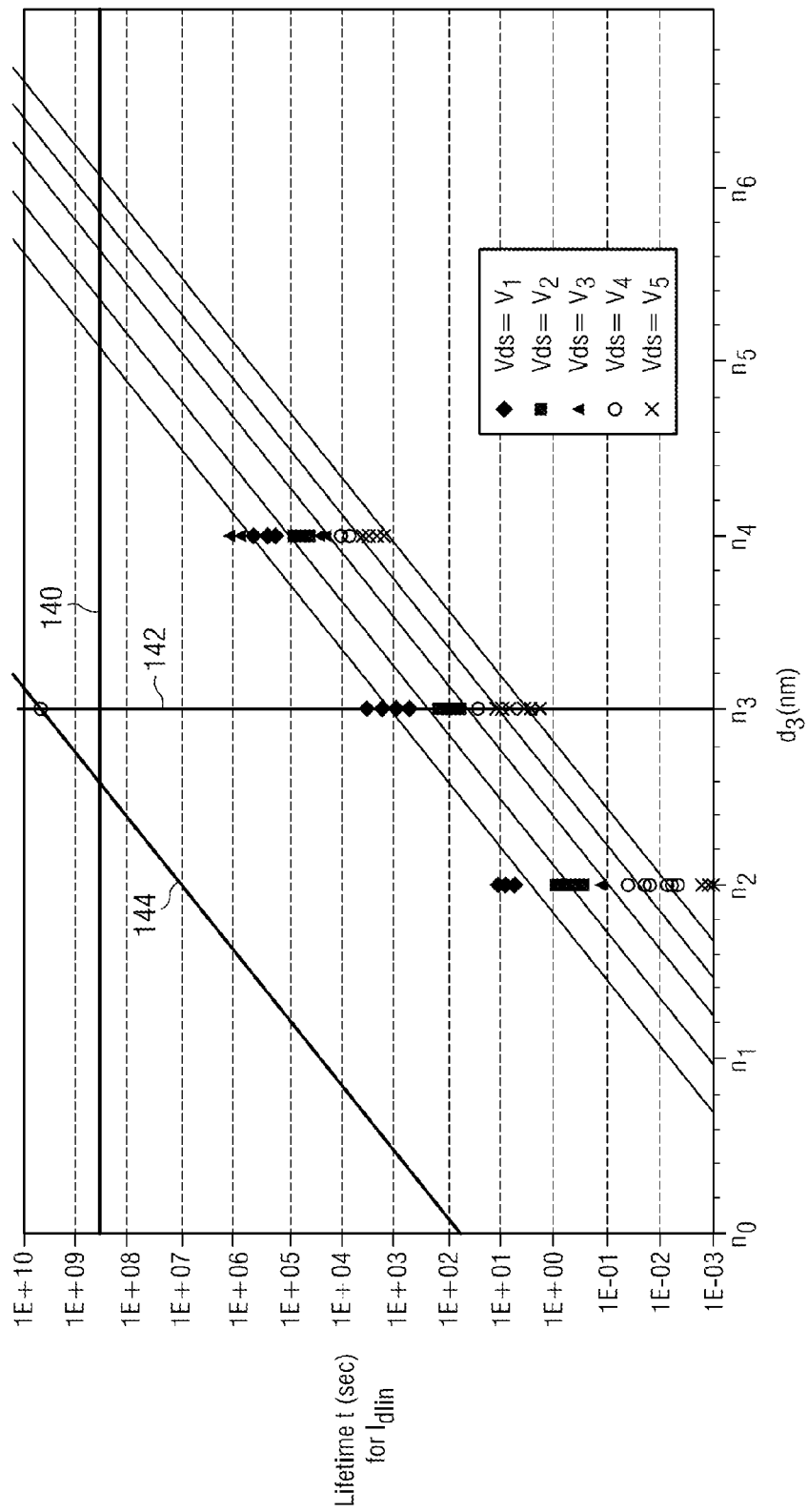
FIG. 5 is a graph illustrating projected lifetimes of devices based on accelerated tests for a range of misalignment values.

FIG. 5 is a graph illustrating projected lifetimes of high voltage devices 110a based on accelerated tests for a range of misalignment values. The graph was used to estimate the time t(secO) for $i_{dlin}$, to determine when a change of about 5% in the lifetime expectation of a device 110a as a function of $d_3$ at stress conditions would be expected to occur, for example. The graph illustrates simulated results for different values $n_0$ through $n_6$ for dimension $d_3$ at voltage levels $V_1$ through $V_5$ over a lifetime t(sec) for current $I_{dlin}$ of a device 110a. In the simulation used to produce the graph, dimension $n_3$ for $d_3$ was a predetermined distance in nm (shown at 142), increments of 50 nm were used +/− the predetermined distance for $n_2$ and $n_4$, increments of 100 nm were used +/− the predetermined distance for $n_1$ and $n_5$, and increments of 150 nm were used +/− the predetermined distance for $n_0$ and $n_6$, for example. The voltage levels $V_1$ through $V_5$ ranged from about 5.8 volts to 7 volts. The lifetime target for the device 110a is shown at 140, and the lifetime of the device 110a extrapolated to operating conditions is shown at 144. The graph illustrates and quantifies hot carrier degradation for devices 110a and/or 110b, wherein the lifetime is predicted to be reduced by about one order of magnitude by a misalignment of about 20 nm, for example.

FIGS. 6 through 10 show examples of arrangements of devices 110a and 110b in the first and second regions 104 and 106 in arrays 102 in accordance with embodiments of the present invention. The devices 110a and 110b may be formed in many different configurations within a first or second region 104 and 106, and the first and second regions 104 and 106 may be combined together in many different types of arrangements within an array 102.

Figure 6:
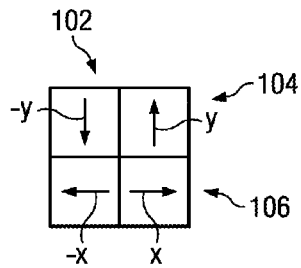
FIGS. 6 through 10 show examples of device arrangements of the first and second regions in arrays in accordance with embodiments of the present invention.
Figure 7:
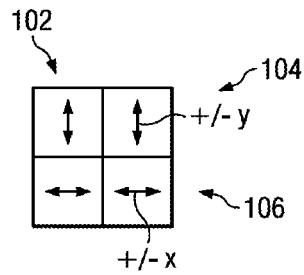
Figure 8:
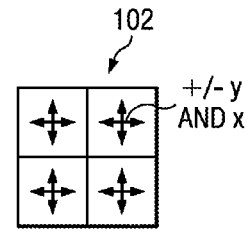

In some embodiments, at least one first region 104 and at least one second region 106 may be formed into a cell comprised of differently oriented first and second high voltage devices, wherein the cell is repeated a plurality of times in the array, as shown in FIGS. 6, 7, and 8. In FIG. 6, a portion of an array 102 is shown, wherein one first region 104 comprises devices 110a oriented in a +y direction and one first region 104 comprises devices 110b oriented in a −y direction. Similarly, one second region 106 comprises devices 110b oriented in a +x direction and one second region 106 comprises devices 110b oriented in a −x direction. Regions 104 and 106 may comprise a cell comprising devices 110a and 110b oriented at 0 degrees, 90 degrees, 180 degrees, and 270 degrees, for example. The cell may be repeated many times in an array 102. If misalignment occurs in one direction, e.g., in the +y direction, performance of devices is affected in the second regions 106 having devices oriented in the +/−x direction. Devices oriented in the +x direction may be positively affected, whereas devices oriented in −x direction may be negatively affected, or vice versa, for example. Devices oriented in the +/−y direction in first regions 104 are not affected by the +y direction misalignment, advantageously.

FIG. 7 shows another embodiment of the present invention, wherein a cell or portion of an array 102 comprises at least one first region 104 having devices oriented in both a +/−y direction and at least one second region 106 having devices oriented in both a +/−x direction. FIG. 8 shows yet another embodiment of the present invention, wherein the cell or portion of the array 102 comprises a plurality of regions having devices 110a and 110b oriented in the +/−y direction and +/−x direction. Again, the cells or portions of the array 102 shown in FIGS. 7 and 8 may be repeated many times in an array 102.

Figure 9:
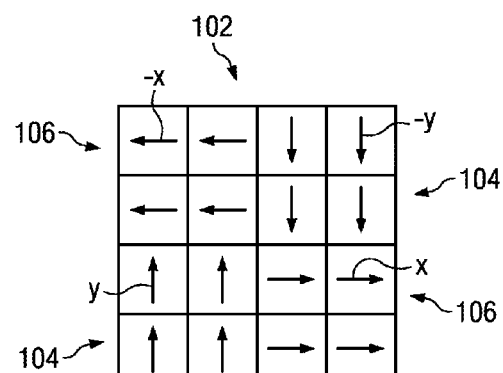
Figure 10:
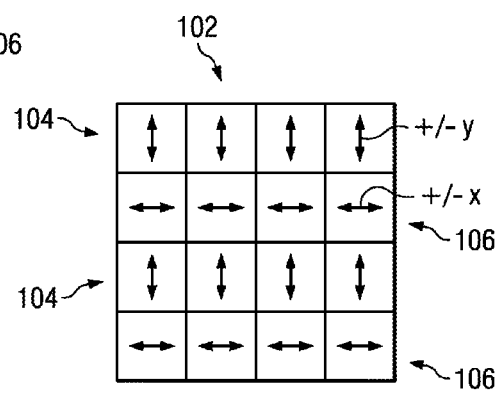

In other embodiments, a plurality of first regions 104 and/or second regions 106 may be formed into rows, columns, or blocks, as shown in FIGS. 9 and 10. FIG. 9 shows an example wherein some regions of the array 102 comprise blocks of first regions 104 oriented in the y direction, and other regions of the array 102 comprise blocks of first regions 104 oriented in the −y direction. Some regions of the array 102 comprise blocks of second regions 106 oriented in the x direction, and other regions of the array 102 comprise blocks of second regions 106 oriented in the −x direction. FIG. 10 shows another example wherein alternating rows of first regions 104 and second regions 106 comprise devices oriented in the +/−y direction and +/−x direction, respectively.

Note that the arrays 102 and the arrangements of the devices 110a and 110b in the first regions 104 and second regions 106 illustrated herein are merely exemplary. Other arrangements and combinations may also be formed, wherein some devices 110b are oriented differently than other devices 110a in the array 102.

Figure 11:
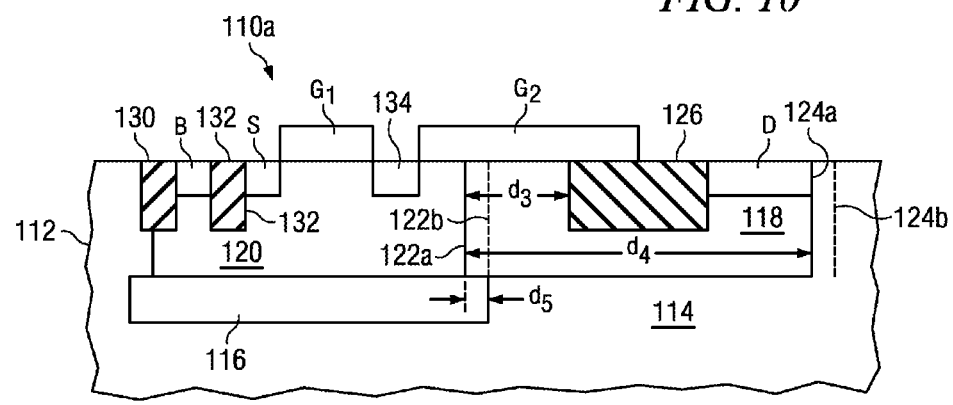
FIG. 11 shows a cross-sectional view of a device of the array of FIG. 1 in accordance with another embodiment of the present invention, wherein the device comprises a p channel lateral DMOS device.

FIG. 11 shows a cross-sectional view of a device 110a of the array of FIG. 1 in accordance with another embodiment of the present invention, wherein the device 110a comprises a p channel lateral DMOS device. Like numerals are used for the various elements that were used to describe the previous figures, and to avoid repetition, each reference number shown in FIG. 11 is not described again in detail herein.

In this embodiment, the first well 120 comprises a P well, and the third well 116 is disposed beneath the first well 120, the third well 116 comprising an N well or Nband. The second well 118 disposed beneath the second gate $G_2$ comprises an N well. The critical dimension in the p channel device 110a again comprises dimension $d_3$ within the second well 118, between the junction 122a and the left edge of the STI or isolation region 126, for example, as described for the n channel device 110a in FIG. 2. A misalignment of dimension $d_5$ decreases the performance of the device 110a.

Figure 12:
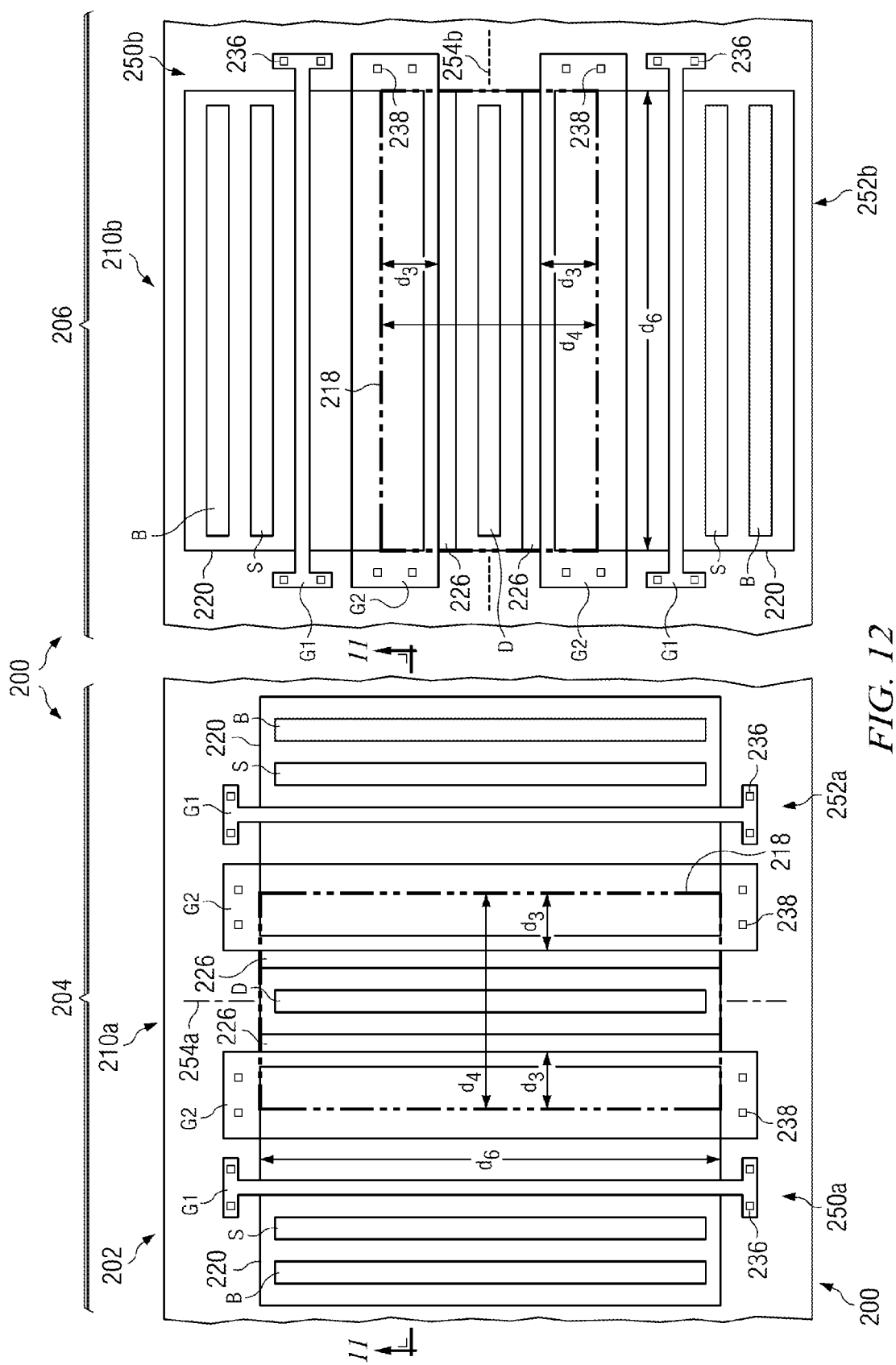
FIG. 12 shows a top view of yet another embodiment of the invention, wherein the devices of the array comprise mirrored lateral DMOS devices coupled in parallel and sharing a common drain contact.

FIG. 12 shows a top view of yet another embodiment of the invention, wherein the devices 210a and 210b of the array 202 comprise mirrored lateral DMOS devices coupled in parallel and sharing a common drain contact D. Like numerals are used for the various elements that were used to describe FIGS. 1 through 11. To avoid repetition, each reference number shown in FIG. 12 is not described again in detail herein. Rather, similar materials and components x02, x04, x06, x08, etc. . . . are preferably used for the various materials and components shown as were described for FIGS. 1 through 11, where x=1 in FIGS. 1 through 11 and x=2 in FIG. 12.

The mirrored lateral DMOS devices 210a in the first region 204 comprise two high voltage transistors 250a and 252a comprising a substantially minor image about a central axis 254a in a central region of the drain contact D of the device 210a. Likewise, the mirrored lateral DMOS devices 210b in the second region 206 comprise two high voltage transistors 250b and 252b comprising a substantially mirror image about a central axis 254b in a central region of the drain contact D of the device 210b. In a correctly aligned array 202, the dimension $d_3$ is substantially the same for both high voltage transistors (250a and 252a) and (250b and 252b) of the mirrored lateral DMOS devices 210a and 210b, respectively, as shown in FIG. 12.

Figure 13:
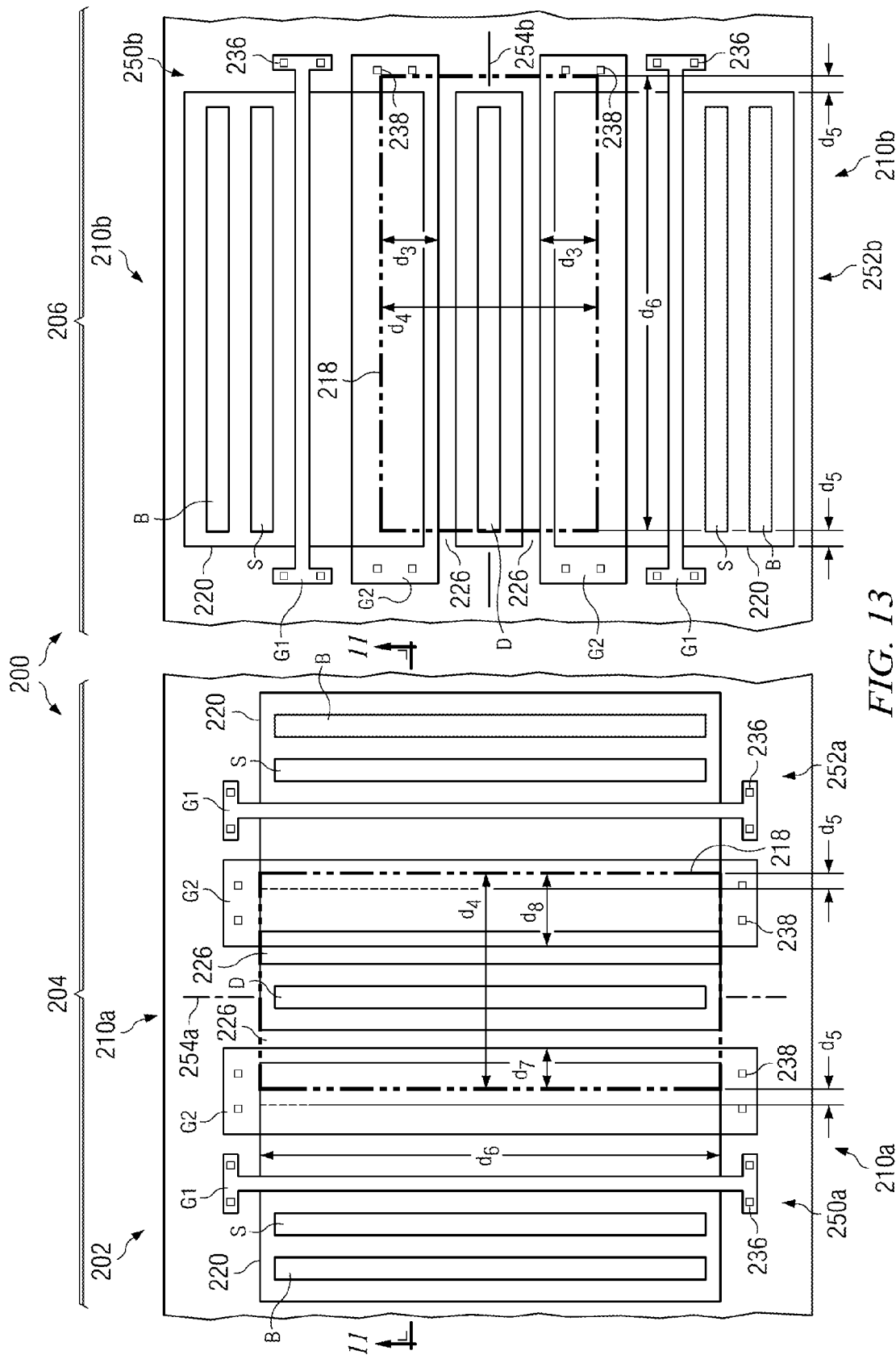
FIG. 13 shows a top view of the semiconductor device shown in FIG. 12 wherein a misalignment of a portion of the semiconductor device causes decreased device performance on one side of the mirrored lateral DMOS device and causes increased device performance on the other side of the device in the first region, yet the misalignment has no effect on the mirrored lateral DMOS device in the second region.

FIG. 13 shows a top view of the semiconductor device 200 shown in FIG. 12, wherein a misalignment of a portion of the semiconductor device 200, e.g., in the +x direction, causes decreased device performance on one side (e.g., transistor 250a) of the mirrored lateral DMOS device 210a and causes increased device performance on the other side of the device 210a (e.g., transistor 252a) in the first region 204, yet the misalignment has no effect on the mirrored lateral DMOS device 210b in the second region 206. Dimension $d_3$ is decreased by amount $d_5$ to dimension $d_7$ for transistor 250a, and dimension $d_3$ is increased by amount $d_5$ for transistor 252a to dimension $d_8$, for example, decreasing the performance of transistor 250a and increasing the performance of transistor 252a. Thus, negative effects of the misalignment on transistor 250a are compensated for by an improvement in the performance of transistor 252a.

Figure 14:
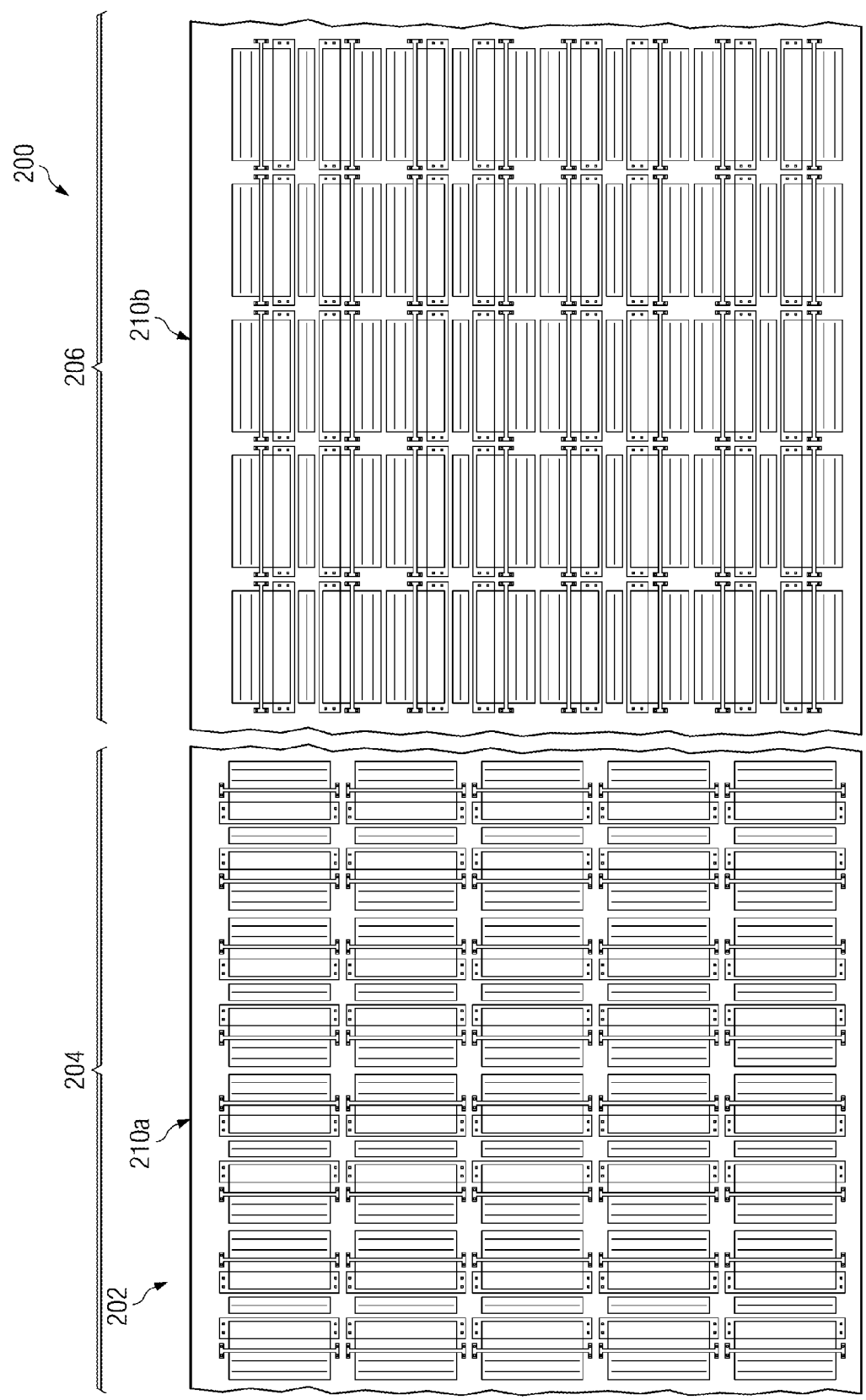
FIG. 14 shows an array with a plurality of y oriented mirrored high voltage lateral DMOS devices in the first region and a plurality of x oriented mirrored high voltage lateral DMOS devices in the second region in accordance with an embodiment of the present invention.

FIG. 14 shows a semiconductor device 200 comprising an array 202 with a plurality of y oriented mirrored high voltage lateral DMOS devices 210a in the first region 204 and a plurality of x oriented mirrored high voltage lateral DMOS devices 210b in the second region 206 in accordance with an embodiment of the present invention. Other arrangements of an array 202 having devices 210a and 210b oriented in substantially perpendicular directions to one another may also be used, in accordance with embodiments of the present invention.

In some embodiments, arrays 102 and 202 of high voltage devices 110a, 110b, 210a, and 210b are formed wherein a behavior of the high voltage devices 110a, 110b, 210a, and 210b is a function of an alignment of at least one process step used to manufacture the devices 110a, 110b, 210a, and 210b. The robustness or statistical spread of parameters of the devices 110a, 110b, 210a, and 210b may depend on the x-y misalignment of at least one process step, in some embodiments. For example, the at least one process step may comprise forming a well boundary such as junction 122a shown in FIG. 2 under a gate $G_2$, wherein the well boundary or junction 122a is not self-aligned to the gate $G_2$. In other words, the well boundary 122a and the gate $G_2$ may not be directly aligned to each other; e.g., the well boundaries 122a may be formed by implantation processes and/or lithography processes that are aligned to alignment marks (not shown) on a semiconductor wafer or workpiece 112, and the gates $G_2$ may be formed by aligning to isolation regions 126 (e.g., that may be formed by aligning to the same alignment marks on the workpiece 112), so that the well boundaries 122a and gates $G_2$ are not self-aligned or directly aligned to one another. Advantageously, because some devices 110a and 210a in the array 102 and 202 are positioned in a second direction y that is substantially perpendicular to the position in a first direction x of devices 110b and 210b, negative effects on the array 102 and 202 performance are reduced that may be caused due to misalignments of the gates $G_2$ to the well boundaries 122a, resulting in improved performance of the overall array 102 and 202. For example, orienting the devices 110a, 110b, 210a, and 210b differently may result in an improved voltage robustness, reduced statistical spread of a hot carrier degradation, or reduced statistical spread of performance parameters of overall array 102 and 202. Reducing the statistical spread of hot carrier degradation advantageously results in longer lifetime of the arrays 102 and 202, for example. The performance parameters with reduced statistical spread may comprise parameters that influence circuit performance in direct current (DC), alternating current (AC), radio frequency (RF), and switching applications, as examples. The performance parameters with reduced statistical spread may include device 110a, 110b, 210a, and 210b resistance, current, leakage, gain, capacitance, or speed, as examples, although other performance parameters may also be improved.

Embodiments of the present invention include semiconductor devices 100 and 200 that include the novel arrays 102 and 202 described herein with devices 110a, 110b, 210a, and 210b oriented in different directions. Embodiments of the present invention also include methods of fabricating the semiconductor devices 100 and 200 described herein, for example. Although the transistor devices shown in the drawings comprise two or more gates, embodiments of the present invention may also be implemented in arrays of transistors comprising one gate, for example. Embodiments of the present invention may be implemented in arrays of many different types of transistors, such as drain extended MOS (DEMOS) devices, for example.

Advantages of embodiments of the invention include providing novel array 102 and 202 arrangements for high voltage devices 110a, 110b, 210a, and 210b that result in a reduction in hot carrier degradation of the array 102 and 202. Reduced statistical spread, e.g., of parameters such as hot carrier degradation and "on" current $I_{on}$ of the overall array 102 and 202 of devices 110a, 110b, 210a, and 210b, is also achieved. The novel array 102 and 202 arrangements comprise combinations of devices 110a, 110b, 210a, and 210b that are rotated by 90 degrees. The typical misalignment effect that leads to a statistical spread is typically independent of the x-y orientation so that misalignment in x and y directions are uncorrelated. However, by placing devices 110a, 110b, 210a, and 210b with a 90 degree angle so that all four perpendicular angles are addressed in accordance with some embodiments of the present invention, the performance is averaged over all devices 110a, 110b, 210a, and 210b in the array 102 and 202, reducing the device statistical spread and improving the hot carrier performance. For a typical high voltage device 110a, 110b, 210a, and 210b, an improvement of hot carrier robustness may be a determining factor in determining failures in lifetime criteria for a device construction in certain applications, for example.

Embodiments of the present invention result in reducing the overall effect of well misalignment in high voltage circuits, and result in reducing the effects related to the misalignment, such as hot carrier drift. The novel arrays 102 and 202 involve the parallel usage of high voltage devices 110a, 110b, 210a, and 210b that are rotated by 90 degrees and other 90 degree increments. One benefit of this novel array 102 and 202 configuration is that the main origin of statistical spread may be reduced by averaging. Also, hot carrier robustness is improved, which is a critical parameter for a high voltage device 110a, 110b, 210a, and 210b, and which translates into area reduction due to a reduced device performance drift.

In arrays 102 wherein the high voltage devices 110a and 110b comprise non-shared drains, e.g., having a single source, as shown in FIGS. 2, 3, and 11, lithography and implantation misalignments that may inadvertently occur in the manufacturing process for the diffused region of the high voltage devices have about 50% less impact on the performance of the array. If devices 110a and 110b in such arrays are positioned in both a +/−y direction and a +/−x direction, misalignments may have about 25% less impact on the performance of the array 102, for example.

In arrays wherein the high voltage devices 210a and 210b comprise shared drains, e.g., having two sources, as shown in FIG. 12, lithography and implantation misalignments that may occur for the diffused region of the high voltage devices 210a and 210b may have only about 25% or less deleterious impact of the performance of the array 202, for example. For example, if the high voltage devices 210a and 210b comprises mirrored high voltage devices, one high voltage transistor may have decreased performance due to a misalignment, which may be partially compensated for by increased performance due to the misalignment, resulting in an overall array 202 decrease in performance of about 15% or less in some applications.

Thus, embodiments of the present invention result in improved device 110a, 110b, 210a, and 210b performance and increased semiconductor device 100 and 200 lifetime. Embodiments of the present invention are easily implementable in existing manufacturing process flows, with few additional processing steps being required for implementation of the invention, for example.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a semiconductor device, the method comprising:
   forming an array on a semiconductor substrate having a major surface, the major surface having a first direction and a second direction different than the first direction, the array comprising a plurality of first regions arranged in a first row of the array and a plurality of second regions arranged in a second row of the array, wherein each of the plurality of first regions comprise a plurality of first devices having a current flow direction oriented in the first direction, wherein each of the plurality of second regions comprise a plurality of second devices having a current flow direction oriented in the second direction, wherein each of the plurality of first devices comprises a first high voltage device, wherein the first high voltage device comprises a first source contact and a first drain contact, wherein at least one first gate contact and at least one second gate contact are disposed between the first source contact and the first drain contact, the first source contact being disposed over and adjacent to a first well disposed within the semiconductor substrate, the first well comprising a first type, the first drain contact being disposed over and adjacent to a second well disposed within the semiconductor substrate, the second well comprising a second type, a junction being disposed between the first well and the second well, wherein a third well having the first type is disposed under the second well and an edge portion of the first well, and wherein the third well forms a junction with the second well.

2. The method according to claim 1, wherein the first high voltage device further comprises an isolation region disposed between the first drain contact and the at least one second gate contact, wherein the at least one first gate contact is disposed over a portion of the first well, and wherein the at least one second gate contact is disposed between the first gate contact and the first drain contact, the at least one second gate contact being disposed over a portion of the first well, the junction, a portion of the second well, and a portion of the isolation region.

3. The method according to claim 2, wherein if a misalignment occurs when forming the second well or the isolation region, a distance between the junction and the isolation region within the second well is altered in the first device in the first region, but not in the second device in the second region.

4. The method according to claim 3, wherein the first high voltage device comprises a first high voltage transistor and a second high voltage transistor, the first high voltage transistor and the second high voltage transistor being coupled together in parallel and share the first drain contact, and wherein the first high voltage device comprises two first gate contacts, two second gate contacts, and two source contacts.

5. The method according to claim 4, wherein if a misalignment occurs when forming the second well or the isolation region, a distance between the junction and the isolation region within the second well is altered in the plurality of first devices in the plurality of first regions, but not in the plurality of second devices in the plurality of second regions.

6. The method according to claim 1, wherein one of the plurality of first regions comprising devices oriented in a +y direction but not in an opposite −y direction, another one of the plurality of first regions comprising devices oriented in a −y direction but not in an opposite +y direction, one of the plurality of second regions comprising devices oriented in a +x direction but not in an opposite −x direction, and another of the plurality of second regions comprising devices oriented in a −x direction but not in an opposite +x direction.

7. The method according to claim 1, wherein the plurality of first regions comprises high voltage devices oriented in both +/− directions along the first direction and in both +/− directions along the second direction, and wherein the plurality of second regions comprises high voltage devices oriented in both +/− directions along the first direction and in both +/− directions along the second direction.

8. The method according to claim 1, wherein the plurality of first regions and the plurality of second regions are arranged in alternating rows, wherein the plurality of first regions comprises high voltage devices oriented in both +/− directions along the first direction and the plurality of second regions comprises high voltage devices oriented in both +/− directions along the second direction.

9. The method according to claim 1, wherein each of the plurality of first devices comprises a first mirrored device having a first mirror plane along the second direction, and wherein each of the plurality of second devices comprises a second mirrored device having a second mirror plane along the first direction, wherein the first mirrored device comprises a first source contact, a first drain contact, and a first body contact oriented along the second direction, wherein the second mirrored device comprises a second source contact, a second drain contact, and a second body contact oriented along the first direction.

10. A method of manufacturing a semiconductor device, the method comprising:
    forming a first plurality of high voltage devices and a second plurality of high voltage devices on a semiconductor substrate by
        forming a plurality of isolation regions in the semiconductor substrate,
        implanting a plurality of first wells in the semiconductor substrate,
        implanting a plurality of second wells in the semiconductor substrate,
        forming a junction between each adjacent first well and second well,
        forming a drain contact over each of the plurality of second wells,
        forming a source contact over each of the plurality of first wells,
        forming a first gate over each of the plurality of first wells, and
        forming a second gate over at least the junction, and
    wherein the first plurality of high voltage devices and the second plurality of high voltage devices are arranged in an array, the array comprising a plurality of first regions and a plurality of second regions arranged in rows and columns, the plurality of first regions and the plurality of second regions being arranged in alternate rows of the array, the plurality of first regions comprising the first plurality of high voltage devices having a current flow direction oriented in a first direction, the plurality of second regions comprising the second plurality of high voltage devices having a current flow direction oriented in a second direction, wherein the second direction is substantially perpendicular to the first direction,
    wherein a third well having the first type is disposed under the second well and an edge portion of the first well, and wherein the third well forms a junction with the second well.

11. The method according to claim 10, wherein forming the first plurality of high voltage devices comprises forming a first type of transistor and forming second plurality of high voltage devices comprises forming a second type of transistor, the second type of transistor being the same as the first type of transistor.

12. The method according to claim 10, wherein forming the plurality of high voltage devices comprises forming n channel lateral diffused metal oxide semiconductor (LDMOS) devices, p channel LDMOS devices, or drain extended MOS devices.

13. The method according to claim 10, wherein forming the plurality of high voltage devices comprises forming an array of high voltage devices for a power application, a power control application, a cellular phone application, or a switching application.

14. The method according to claim 10, wherein a behavior of the first plurality of high voltage devices is a function of an alignment of at least one process step.

15. The method according to claim 14, wherein the at least one process step comprises forming a well boundary under a gate.

16. The method according to claim 10, wherein the plurality of first regions comprises high voltage devices oriented in both +/− directions along the first direction and the plurality of second regions comprises high voltage devices oriented in both +/− directions along the second direction.

17. The method according to claim 10, wherein each of the first plurality of high voltage devices comprises a first mirrored device having a first mirror plane along the second direction, and wherein each of the second plurality of high voltage devices comprises a second mirrored device having a second mirror plane along the first direction, wherein the source contact, the drain contact, and a body contact of the first plurality of high voltage devices is oriented along the second direction, wherein the source contact, the drain contact, and a body contact of the second plurality of high voltage devices is oriented along the first direction.

18. A method of manufacturing a semiconductor device, the method comprising:
    forming first high voltage devices in a first plurality of regions of a semiconductor substrate, wherein forming the first high voltage device comprise
        forming a first plurality of isolation regions in the semiconductor substrate,
        implanting a first plurality of first wells in the semiconductor substrate, implanting a first plurality of second wells in the semiconductor substrate, forming a first junction between each adjacent first well and second well, forming a first drain contact over each of the plurality of second wells, forming a first source contact over each of the plurality of first wells, forming a first body contact over each of the plurality of first wells, forming a first gate oriented along a first direction over each of the plurality of first wells, and forming a second gate oriented along the first direction over at least the junction, and forming second high voltage devices in a second plurality of regions of the semiconductor substrate, wherein forming the second high voltage devices comprise forming a second plurality of isolation regions in the semiconductor substrate, implanting a second plurality of first wells in the semiconductor substrate, implanting a second plurality of second wells in the semiconductor substrate, forming a second junction between each adjacent first well and second well, forming a second drain contact over each of the plurality of second wells, forming a second source contact over each of the plurality of first wells, forming a second body contact over each of the plurality of first wells, forming a third gate oriented along a second direction over each of the plurality of first wells, and forming a fourth gate oriented along the second direction over at least the junction, wherein the third gate and the fourth gate are oriented perpendicular to the first gate and the second gate, wherein the first plurality of regions and the second plurality of regions are arranged in an array, wherein the first plurality of regions and the second plurality of regions are arranged in alternate rows of the array, wherein the first plurality of regions are arranged in a first row and a third row of the array, and wherein the second plurality of regions are arranged in a second row and a fourth row of the array, wherein a third well having the first type is disposed under the second well and an edge portion of the first well, and wherein the third well forms a junction with the second well.

19. The method according to claim 18, wherein each of the first high voltage devices comprises a first mirrored device having a first mirror plane along the first direction, and wherein each of the second high voltage devices comprises a second mirrored device having a second mirror plane along the second direction, wherein the first mirrored device comprises the first source contact, the first drain contact, and the first body contact oriented along the first direction, wherein the second mirrored device comprises the second source contact, the second drain contact, and the second body contact oriented along the second direction.

* * * * *